(12) United States Patent
Zhao

(10) Patent No.: US 11,862,595 B2
(45) Date of Patent: Jan. 2, 2024

(54) PACKAGING METHOD FOR FAN-OUT WAFER-LEVEL PACKAGING STRUCTURE

(71) Applicant: SJ Semiconductor(Jiangyin) Corporation, Jiangyin (CN)

(72) Inventor: Hailin Zhao, Jiangyin (CN)

(73) Assignee: SJ SEMICONDUCTOR(JIANGYIN) CORPORATION, Jiangyin (CN)

(*) Notice: Subject to any disclaimer, the term of this patent is extended or adjusted under 35 U.S.C. 154(b) by 322 days.

(21) Appl. No.: 17/469,783

(22) Filed: Sep. 8, 2021

(65) Prior Publication Data

US 2022/0077096 A1 Mar. 10, 2022

(30) Foreign Application Priority Data

Sep. 8, 2020 (CN) .......................... 202010935518.X

(51) Int. Cl.
*H01L 23/00* (2006.01)
*H01L 25/00* (2006.01)
*H01L 21/683* (2006.01)
*H01L 25/065* (2023.01)

(52) U.S. Cl.
CPC .............. *H01L 24/19* (2013.01); *H01L 24/11* (2013.01); *H01L 24/73* (2013.01); *H01L 25/50* (2013.01); *H01L 21/6836* (2013.01); *H01L 25/0655* (2013.01); *H01L 2224/73209* (2013.01); *H01L 2924/014* (2013.01); *H01L 2924/01028* (2013.01); *H01L 2924/01029* (2013.01); *H01L 2924/01079* (2013.01); *H01L 2924/07025* (2013.01); *H01L 2924/186* (2013.01); *H01L 2924/3511* (2013.01); *H01L 2924/37001* (2013.01)

(58) Field of Classification Search
CPC ..... H01L 24/19; H01L 21/6836; H01L 24/11; H01L 25/0655; H01L 2924/186
See application file for complete search history.

(56) References Cited

U.S. PATENT DOCUMENTS

2018/0269160 A1* 9/2018 Su .......................... H01L 24/19

* cited by examiner

*Primary Examiner* — Mohammad M Choudhry
(74) *Attorney, Agent, or Firm* — Alston & Bird LLP

(57) ABSTRACT

The present disclosure provides a packaging method for a fan-out wafer-level packaging structure, including: providing two or more semiconductor chips, and bonding the semiconductor chips to a bonding layer; packaging the semiconductor chips by a plastic packaging layer; removing the bonding layer, and forming a redistribution layer on the semiconductor chips, so as to achieve interconnection between the semiconductor chips, where the redistribution layer includes one or more redistribution sublayers stacked in sequence, and a method for forming each redistribution sublayer includes: forming a dielectric layer on the semiconductor chips; forming vias in the dielectric layer by photolithography; baking the dielectric layer having the vias formed therein, wherein the warpage of the dielectric layer around the vias is mitigated; curing the dielectric layer; and forming on the dielectric layer a patterned metal distribution layer corresponding to the vias; and forming metal bumps on the redistribution layer.

10 Claims, 4 Drawing Sheets

PACKAGING METHOD FOR FAN-OUT WAFER-LEVEL PACKAGING STRUCTURE

CROSS REFERENCE TO RELATED APPLICATION

The present application claims the benefit of priority to Chinese Patent Application No. CN 202010935518X, entitled "PACKAGING METHOD FOR FAN-OUT WAFER-LEVEL PACKAGING STRUCTURE", filed with CNIPA on Sep. 8, 2020, the disclosure of which is incorporated herein by reference in its entirety for all purposes.

FIELD OF TECHNOLOGY

The present disclosure generally relates to semiconductor packaging technologies, and in particular, to a packaging method for a fan-out wafer-level packaging structure.

BACKGROUND

The rapid development of the integrated circuit manufacturing industry has led to increasingly higher requirements for integrated circuit packaging technologies. Existing packaging technologies include ball grid array packaging (BGA), chip scale packaging (CSP), wafer-level packaging (WLP), three-dimensional packaging (3D), system-in-package (SiP) technology, and so on. The WLP technology has been gradually adopted by more semiconductor manufacturers due to its outstanding advantages. Most of WLP processes are completed on a silicon wafer on which previous device processes have been performed, the wafer is then cut, and separate chips are obtained. The WLP technology has unique advantages: it has high packaging processing efficiency, as well as multiple wafers can be processed simultaneously; it also has the advantages of flip-chip packaging, thus the packages are light, thin, short, and small. Plus compared with older technologies, only two more process steps are added in WLP, which are, arranging a redistribution layer (RDL) for pins and providing protruding points; as the result, the number of total tests required is reduced. Therefore, large integrated circuit packaging enterprises are investing more in research, development, and production of WLP.

Fan-out WLP has high interest among manufacturers such as mobile device vendors due to its advantages of easy miniaturization, low cost and high integration. Fan-out WLP is currently the best suited for the demanding mobile/wireless market and is also highly attractive to other markets that focus on high performance and small sizes.

Existing fan-out WLP process generally includes first bonding a semiconductor chip to a bonding layer of a support substrate, and then packaging the bonding layer by a plastic packaging material. During the plastic packaging, the plastic packaging material is heated to a liquid state at a high temperature and is then pressed. The process results in warpage of the wafer, which is generally center-upward warpage (as shown in FIG. 1). When the wafer is warped, follow-up packaging processes may face severe challenges. For example, when a redistribution layer (RDL) is formed subsequently, when photolithography is performed on a dielectric layer of the redistribution layer, topography of via holes of the dielectric layer may be deformed due to the warpage of the wafer, in which case the risk of poor contact between the redistribution layer and the chip increases, and the yield of wafer packaging can be affected.

SUMMARY

The present disclosure provides a packaging method for a fan-out wafer-level packaging structure. The packaging method comprises:
  providing more than two semiconductor chips each having a pad, and bonding the semiconductor chips to a bonding layer, so as to form a fan-out wafer array;
  packaging the semiconductor chips by a plastic packaging layer;
  removing the bonding layer, and forming a redistribution layer on each of the semiconductor chips, so as to achieve interconnection between the semiconductor chips, where the redistribution layer comprises at one or more redistribution sublayers stacked in sequence, wherein the method for forming each redistribution sublayer comprises: forming a dielectric layer on the semiconductor chips; forming vias in the dielectric layer by photolithography; baking the dielectric layer having the vias formed therein, and eliminating warpage of the dielectric layer around the vias; curing the fan-out wafer array; and forming a patterned metal distribution layer in the vias and on the dielectric layer, with the pattern of the patterned metal distribution layer corresponding to the layout of the vias; and
  forming a metal bump on the redistribution layer.

Optionally, the bonding layer is bonded to a support substrate; and the support substrate and the bonding layer are both removed before the redistribution layer is formed.

Optionally, the dielectric layer is made of one or more of polyimides (PI) and Polybenzoxazole (PBO), and the metal distribution layer is made of one or more of copper, aluminum, nickel, gold, silver, and titanium.

Optionally, the dielectric layer is made of PI, the dielectric layer is baked for 80-120 s at a temperature between 120° C. and 150° C., and the fan-out wafer array is cured for 110-130 min at a temperature between 220° C. and 260° C.

Optionally, the dielectric layer is baked for 100 s at a temperature of 120° C., and the fan-out wafer array is cured for 120 min at a temperature of 240° C.

Optionally, the bonding layer comprises one of an adhesive tape, bonding adhesive made by a spin-coating process, and epoxy resin.

Optionally, the plastic packaging layer comprises one of PI, silica gel, and epoxy resin.

Optionally, forming vias in a lowermost redistribution sublayer comprises: dividing the dielectric layer on the semiconductor chips into a plurality of to-be-etched dielectric layer units; and etching the plurality of to-be-etched dielectric layer units one by one in a predetermined order by photolithography to form vias in each of the plurality of to-be-etched dielectric layer units; wherein the pads of each of the semiconductor chip are exposed from bottoms of the vias; and where a number of the plurality of to-be-etched dielectric layer units is equal to or larger than 2.

Optionally, the metal bump comprises one of a gold-tin solder ball, a silver-tin solder ball, and a copper-tin solder ball, or comprises a metal post and a solder ball formed on the metal post.

Optionally, the metal post comprises copper or nickel elements.

As described above, according to the packaging method for a fan-out wafer-level packaging structure consistent with the present disclosure, when the dielectric layer of the redistribution layer is formed, after the vias are formed in the dielectric layer by photolithography, the dielectric layer having the vias formed therein is baked and cured. Therefore, the topography of the dielectric layer around the vias can be effectively improved, and the warpage of the dielectric layer around the vias can be mitigated, thereby improving the electrical connectivity between the redistribution layer and the chips, and increasing the yield of wafer packaging.

DETAILED DESCRIPTION

Figure 1:
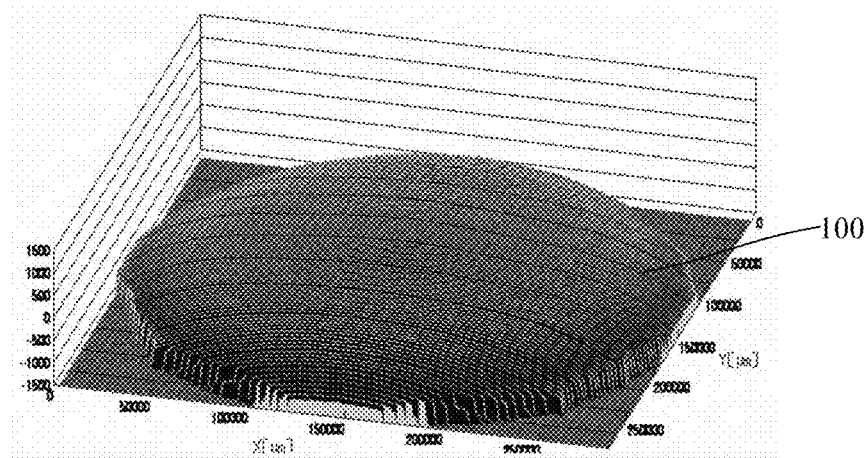
FIG. 1 is a calculated perspective view showing warpage and position drifting of a semiconductor chip on which plastic packaging is performed by existing fan-out wafer-level packaging.

The present disclosure is further explained in detail according to the accompanying drawings. It should be noted that the drawings are schematic representations of the embodiments, and not drawn to scale. The implementations of the present disclosure are described below through specific examples. Those skilled in the art can easily understand the other advantages and effects of the present disclosure from the content disclosed in this specification. The present disclosure can also be implemented or applied through other different specific implementations, and various details in the specification can also be modified or changed based on different viewpoints and applications without departing from the spirit of the present disclosure.

Referring to FIG. 1 to FIG. 16, it should be noted that the drawings provided in this embodiment only exemplify the basic idea of the present disclosure. Therefore, only the components related to the present disclosure are shown in the drawings, and are not drawn according to the quantities, shapes, and sizes of the components during actual implementation. During actual implementation, the types, quantities, and proportions of the components may be adjusted as needed, and the layout of the components may be more complicated.

Figure 2:
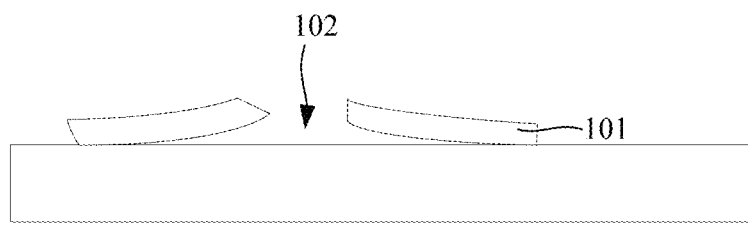
FIG. 2 is a schematic cross-sectional view showing warpage of a dielectric layer when a redistribution layer is formed by the existing fan-out wafer-level packaging.

As shown in FIG. 1, in the existing fan-out wafer-level packaging (WLP) process, after plastic packaging is performed on semiconductor chips, the corresponding wafer 100 may warp. Therefore, follow-up packaging processes may face severe challenges. As shown in FIG. 2, during formation of a dielectric layer of a redistribution layer, due to the warpage of the wafer, when photolithography is performed on the dielectric layer, the dielectric layer is unevenly heated and has inconsistent degrees of exposure and development. The topography of a via 102 formed in the dielectric layer after resist development may be deformed. For example, the dielectric layer around the vias may warp, causing poor contact between a subsequently formed redistribution layer and the chips, thereby affecting the yield of wafer packaging.

In light of the foregoing problem, the present disclosure provides a packaging method for a fan-out WLP structure. The packaging method focuses on back-end processes that are carried out after plastic packaging is performed on the semiconductor chips. When the dielectric layer of the redistribution layer is formed, after the vias are formed in the dielectric layer by photolithography, the dielectric layer having the vias formed therein is baked and cured. Therefore, the topography of the dielectric layer around the vias can be effectively improved, and the warpage of the dielectric layer around the vias can be eliminated. In this way, electrical connectivity between the subsequently formed redistribution layer and the semiconductor chips can be improved, thereby increasing the yield of wafer packaging.

As shown in FIG. 3 to FIG. 16, the packaging method is described as follows.

Figure 3:
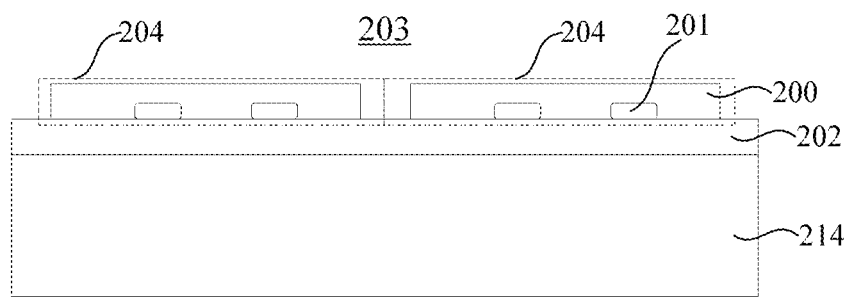
FIG. 3 to FIG. 16 are schematic cross-sectional views showing various intermediate structures obtained after steps of a packaging method for a fan-out wafer-level packaging structure according to the present disclosure.
Figure 4:
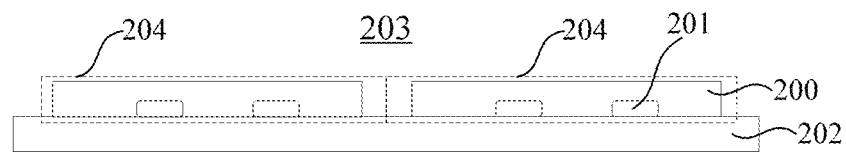

In FIG. 3 and FIG. 4, step 1) is first performed which provides more than two semiconductor chips 200 each having pads 201.

The semiconductor chips 200 may be semiconductor chips requiring packaging. The semiconductor chips may be chips with independent function such as storage chips and circuit chips, or may be integrated function chips such as APU chips and GPU chips, which are not limited herein. The pads 201 in each of the semiconductor chips 200 comprise aluminum element or its alloys. During preparation of making the pads 201, in order to enhance the electrical properties of the pads and the adhesive properties of each semiconductor chip 200, a bonding layer may be formed under the pads 201, and an anti-reflection layer is formed on the surface of the pads 201.

As shown in FIG. 3 and FIG. 4, then step 2) of bonding the semiconductor chips 200 to a bonding layer 202 to form a fan-out wafer array 203 is performed.

It should be noted that, based on requirements for packaging efficiency and package dimensions, there is generally a plurality of semiconductor chips 200 bonded to the fan-out wafer array 203. In some cases, far more than a few semiconductor chips 200 are bonded. The quantity of pads 201 on one semiconductor chip 200 is not limited to 2, and the specific quantity may be set depending on the type of the semiconductor chips 200.

As shown in FIG. 4, as an example, the semiconductor chips 200 are only bonded to the bonding layer 202, so as to form the fan-out wafer array 203. This kind of method incurs little cost, but with this method, warpage and drifting occur easily after subsequent plastic packaging. The bonding layer 202 may be made of materials such as an adhesive tape, UV adhesive formed by spin coating, or epoxy resin. In some embodiment, the bonding layer 202 is made of an UV adhesive layer formed by spin coating, and viscosity of the UV adhesive layer may decrease under ultraviolet irradiation.

As shown in FIG. 3, as an example, the bonding layer 202 is bonded to a support substrate 214, so as to form the fan-out wafer array 203. The support substrate 214 may be made of materials such as glass, ceramic, metal, and polymer. In some embodiment, the support substrate 214 comprises one of glass, transparent semiconductor materials, and transparent polymers, so that an exposure operation on the UV adhesive layer from a back side of the support substrate 214 can be performed, thereby greatly simplifying a subsequent peeling process.

When the semiconductor chips 200 are bonded to the bonding layer 202, the surfaces of the semiconductor chips 200 with the pads 201 are bonded to the bonding layer. After the bonding layer is subsequently removed and before the redistribution layer is formed, the semiconductor chips are inverted, so that the redistribution layer can be formed on the semiconductor chips.

As shown in FIG. 3 and FIG. 4, as an example, the fan-out wafer array 203 may be divided into more than two semiconductor chip units 204, and it's defined that each of the semiconductor chips 200 has a respective initial position. The division is intended to provide a better method for forming the redistribution layer, and the method is to be described in detail below. It should be noted that, the quantity of semiconductor chips 200 in each of the semiconductor chip units 204 may be determined according to a maximum shifted distance of the semiconductor chips 200 in the semiconductor chip unit 204 after subsequent plastic packaging of the semiconductor chips. A quantity of semiconductor chip units 204 may be two or more. In this embodiment, for the convenience of understanding, semiconductor chips 200 arranged in a same row as shown in the figures constituting one semiconductor chip unit 204. Therefore, only one semiconductor chip 200 of a semiconductor chip unit 204 is shown in the cross-sectional view. As an example, two semiconductor chip units 204 arranged in the above mentioned manner are used in the figures for illustration.

Figure 5:
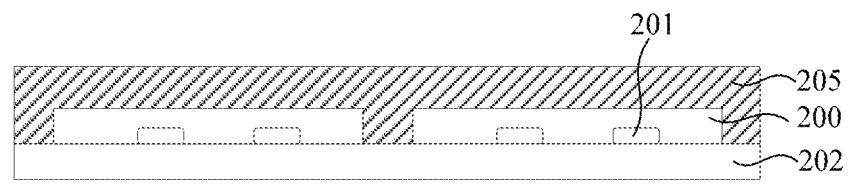

As shown in FIG. 5, step 3) of packaging the semiconductor chips 200 by a plastic packaging layer 205 is then performed.

The semiconductor chips 200 after plastic packaging may shift lateral locations. At this point, each of the semiconductor chips 200 has a respective shifted position, and the shifted position has a shift distance relative to the initial position. During plastic packaging, plastic packaging materials are heated to a liquid state at a high-temperature, and are pressed. Since all of the semiconductor chips 200 are re-bonded one by one to form a wafer array, warpage may occur under the pressure, and the semiconductor chips 200 may drift. That is, after plastic-packaging the semiconductor chips 200, there is a shifted distance from the new position (i.e., shifted position) and the initial position of the semiconductor chip in the wafer array. In addition, since each of the semiconductor chips 200 is located at a different position in the wafer array, directions and degrees of shifting are different for the semiconductor chips 200. Correspondingly, the pads on the semiconductor chips may also shift.

As an example, the plastic packaging layer 205 comprises one of polyimide, silica gel, and epoxy resin. The plastic packaging layer 205 turns opaque after additives are added.

As an example, processes for performing plastic packaging on the semiconductor chips 200 comprise one of an injection molding process, a compression molding process, a printing process, a transfer molding process, a liquid sealant curing process, a vacuum lamination process, and a spin-coating process. In some embodiment, plastic packaging is performed on each of the semiconductor chips 200 by an injection molding process. The plastic packaging layer 205 is made of opaque silica gel.

Figure 6:
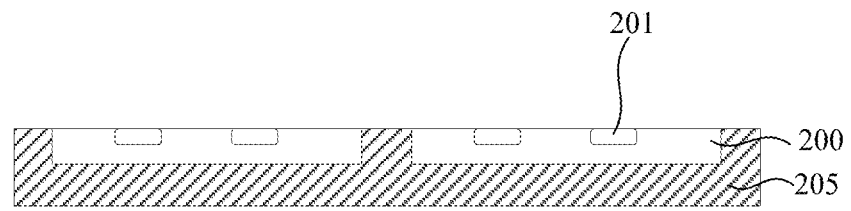
Figure 7:
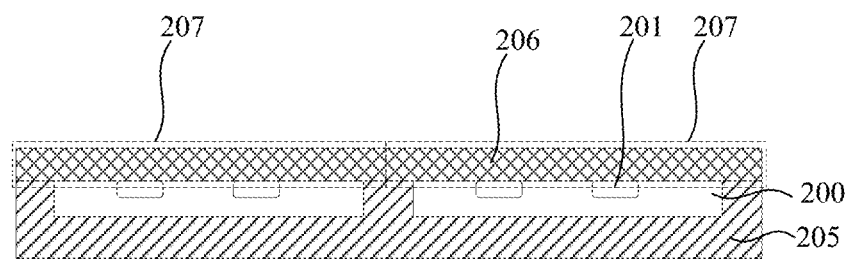
Figure 8:
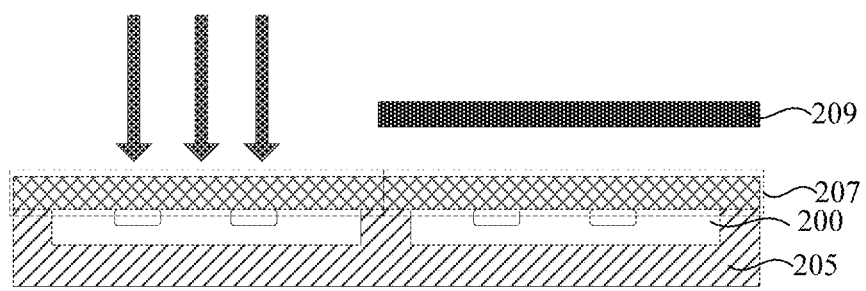
Figure 9:
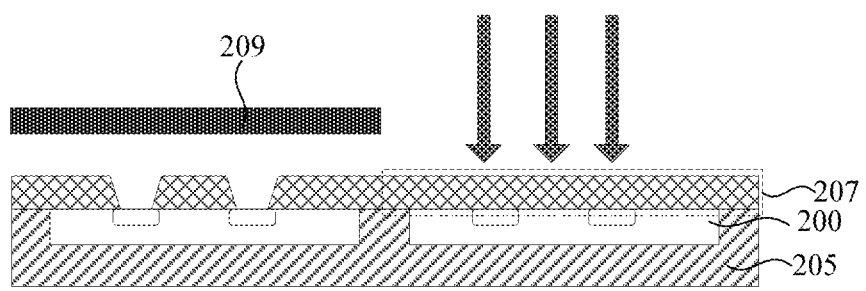
Figure 10:
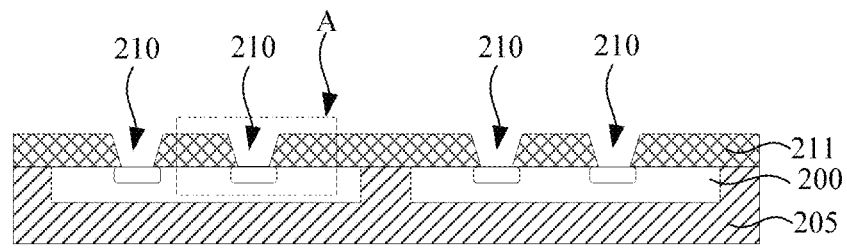
Figure 11:
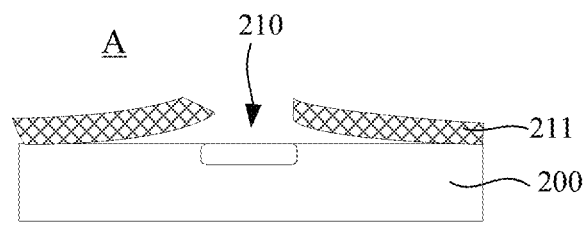
Figure 12:
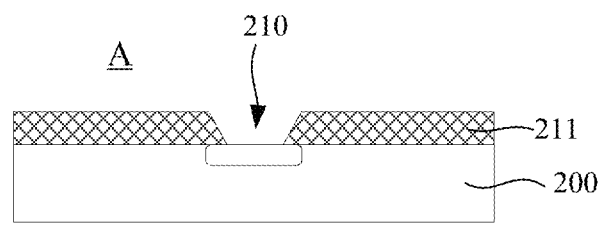
Figure 13:
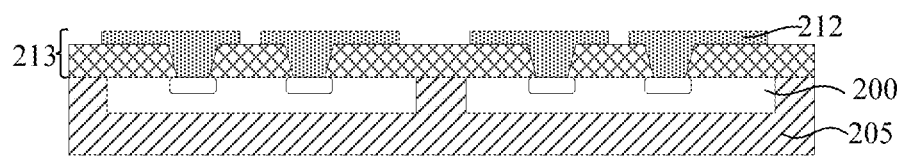
Figure 14:
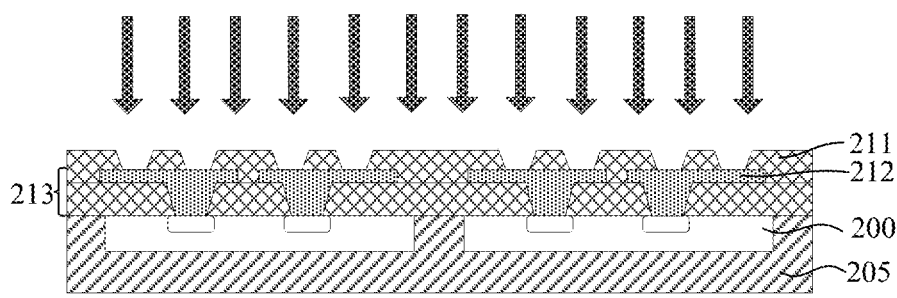
Figure 15:
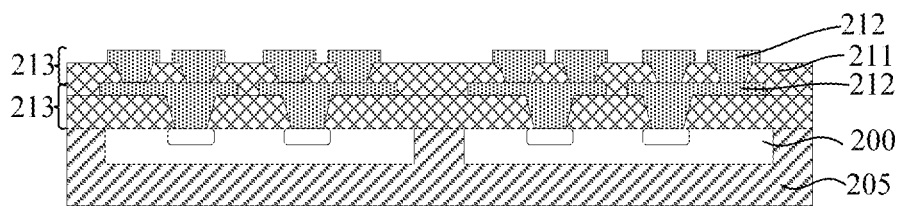

As shown in FIG. 6 to FIG. 15, then step 4) of removing the bonding layer 202 (as shown in FIG. 6), and forming the redistribution layer 208 (as shown in FIG. 15) on the semiconductor chips 200, so as to achieve interconnection between the semiconductor chips 200, is performed. The redistribution layer 208 comprises one or more redistribution sublayers 213 stacked in sequence. A method for forming each redistribution sublayer 213 comprises: forming a dielectric layer 206 on the semiconductor chips 200 (as shown in FIG. 7); forming vias 210 in the dielectric layer 206 by photolithography (as shown in FIG. 10 and FIG. 14); baking the dielectric layer 206 having the vias 210 formed therein, and eliminating warpage of the dielectric layer around the vias (as shown in FIG. 11 and FIG. 12); curing the fan-out wafer array; and forming a patterned metal distribution layer 212 in the vias 210 and on the dielectric layer 206, with the pattern of the patterned metal distribution layer corresponding to the layout of the vias 210 (as shown in FIG. 13 and FIG. 15).

The quantity of the redistribution sublayers 213 in the redistribution layer 208 is set according to specific packaging requirements. The quantity of the sublayers 213 may be one, two, three, or more. For example, FIG. 15 shows two layers. As shown in FIG. 7 to FIG. 10, as a preferred example, a method for forming vias 210 in a first redistribution sublayer 213 (the redistribution sublayer that is in direct contact with the pads 201 of the corresponding semiconductor chip 200) is shown. The method comprises: forming the dielectric layer 206 on the semiconductor chips 200, and dividing the dielectric layer 206 into more than two to-be-etched dielectric layer units 207 (as shown in FIG. 7), wherein the area of each to-be-etched dielectric layer unit 207 is defined by the above semiconductor chip units 204; directly etching all of the to-be-etched dielectric layer units 207 by photolithography (as shown in FIG. 8 to FIG. 10) one by one, so as to form, in the dielectric layer 206, the vias 210 from which the pads 201 of the semiconductor chips 200 are exposed, wherein for etching of each to-be-etched dielectric layer unit 207, the exposure stage position of photolithography is readjusted either by moving the exposure lithography tool stage toward the right, or alternating the mask 209 from opening at left to opening at right; as an example, a photomask 209 having a shielding structure is used so that the to-be-etched dielectric layer unit 207 on the left side is exposed (as shown in FIG. 8), so as to form the vias 210 in the to-be-etched dielectric layer unit 207 on the left side, and the pads 201 on the semiconductor chip 200 in the semiconductor chip unit 204 on the left side is exposed by the vias 210; and adjusting the relative orientations of the photomask 209 having the shielding structure and the to-be-etched dielectric layer unit 207, and then exposing the dielectric layer 206 by the photomask 209 having the shielding structure (as shown in FIG. 9), so as to form the vias 210 in the to-be-etched dielectric layer unit 207 on a right side, where the pads 201 on the semiconductor chip 200 in the semiconductor chip unit 204 on the right side is exposed by the vias 210. The fan-out wafer array 203 is divided into a plurality of units to be exposed and etched. Etching and windowing are performed on each to-be-etched dielectric layer unit 207 in sequence, so as to form the vias from which the pads of a corresponding semiconductor chip are exposed. The photolithography is readjusted during each etching and windowing. That is to say, a single alignment exposure process is divided into a plurality of alignment exposure processes. The exposure stage position of each alignment exposure is adjusted according to shift distances and shift directions of the semiconductor chips of the to-be-etched unit for which the alignment exposure is performed, so that the alignment accuracy of the subsequently formed redistribution layer can be effectively improved because of the high-accuracy of the alignment exposure, thereby effectively increasing the yield of wafer packaging.

When the fan-out wafer array 203 is formed by the bonding layer 202 and the support substrate 214, the support substrate 214 is removed along with the bonding layer 202.

As shown in FIG. 10, after the dielectric layer 206 is patterned by photolithography to form a patterned dielectric layer 211, the vias 210 in the patterned dielectric layer 211 may warp due to plastic packaging of the fan-out wafer array 203. The topography of the vias may also be deformed, which generates warpage (as shown in FIG. 11, an enlarged view of a dashed box A in FIG. 10). The dielectric layer having the vias formed therein is baked, so as to improve the deteriorated topography of the dielectric layer around the vias (as shown in FIG. 12, an enlarged view of the dashed box A in FIG. 10). In this way, the warped dielectric layer can be bonded to materials of a lower layer, and the restored topography of the dielectric layer can be shaped by means of curing, thereby effectively improving the electrical connectivity between the subsequently formed redistribution layer and the semiconductor chips, and increasing the yield of wafer packaging.

In some embodiment, the dielectric layer 206 comprises one or more of PI and PBO. In some embodiment, the PI material is preferably selected as the material of the dielectric layer 206, and the dielectric layer 206 is baked for 80-120 sat a temperature between 120° C. and 150° C., and then is cured for 110-130 min at a temperature between 220° C. and 260° C. In this way, the deteriorated topography of the dielectric layer around the vias can be effectively improved and cured. In some embodiment, the dielectric layer 206 is baked for 100 sat a temperature of 120° C. and cured for 120 min at a temperature of 240° C., so as to approximate an optimal effect of restoring the topography of the dielectric layer 206 around the vias.

As shown in FIG. 13 and FIG. 15, as an example, a metal distribution layer is formed in the vias 210 and on a surface of the patterned dielectric layer 211 by a chemical vapor deposition process, a physical vapor deposition process, a sputtering process, an electroplating process, or a chemical plating process, and is etched to form a patterned metal distribution layer 212. The metal distribution layer comprises one or more elements of copper, aluminum, nickel, gold, silver, and titanium.

Figure 16:
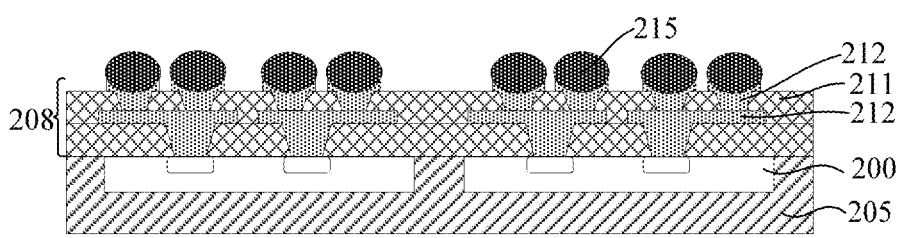

As shown in FIG. 16, step 5) of forming metal bumps 215 on the redistribution layer 208 is finally performed.

As an example, each metal bump 215 comprises one of a gold-tin solder ball, a silver-tin solder ball, and a copper-tin solder ball. Alternatively, the metal bump 215 comprises a metal post and a solder ball formed on the metal post. Preferably, the metal post is a copper post or a nickel post. In some embodiment, the metal bump 215 is a gold-tin solder ball. A method for making the gold-tin solder ball comprises: first forming a gold-tin layer on a surface of the redistribution layer 208, then causing the gold-tin layer to reflow to form a ball by a high-temperature reflow process, and forming the gold-tin solder ball by means of cooling; or forming the gold-tin solder ball by a bumping process.

In summary, the present disclosure provides a packaging method for a fan-out WLP structure, and in the method, when forming the dielectric layer of the redistribution layer, after the vias are formed in the dielectric layer by photolithography, the dielectric layer having the vias formed therein is baked and cured, so that the topography of the dielectric layer around the vias can be effectively improved, and the warpage of the dielectric layer around the vias can be eliminated, thereby improving electrical connectivity between the subsequently formed redistribution layer and the semiconductor chips, and increasing the yield of wafer packaging. Therefore, the present disclosure effectively overcomes various disadvantages in the prior art, and has a high industrial value.

The above embodiments only exemplarily illustrate the principles and effects of the present disclosure, but are not used to limit the invention. A person skilled in the art can modify or change the above embodiments without departing from the spirit and scope of the present disclosure. Therefore, all equivalent modifications or changes made by a person skilled in the art without departing from the spirit and technical idea of the present disclosure shall be covered by the claims of the present disclosure.

What is claimed is:

1. A packaging method for a fan-out wafer-level packaging structure, wherein the packaging method comprises:
    providing two or more semiconductor chips, each of which has one or more pads, and bonding the semiconductor chips to a bonding layer to form a fan-out wafer array;
    packaging the semiconductor chips by a plastic packaging layer;
    removing the bonding layer, and forming a redistribution layer on the semiconductor chips to achieve interconnection between the semiconductor chips, wherein the redistribution layer comprises one or more redistribution sublayers stacked in sequence, wherein a first redistribution sublayer is in contact of the one or more pads;
    wherein a method for forming each of the one or more redistribution sublayers comprises:
        forming a dielectric layer on the semiconductor chips, wherein a warpage is generated in a forming process of the dielectric layer;
        forming vias in the dielectric layer by photolithography;
        baking the dielectric layer having the vias formed therein, wherein baking the dielectric layer eliminates the warpage on the dielectric layer around the vias;
        curing the fan-out wafer array; and
        forming a patterned metal distribution layer in the vias and on the dielectric layer, with the pattern of the patterned metal distribution layer corresponding to the layout of the vias;
    and
    forming metal bumps on the redistribution layer.

2. The packaging method for the fan-out wafer-level packaging structure as in claim 1, wherein the bonding layer is attached to a support substrate; and wherein the support substrate and the bonding layer are both removed before the redistribution layer is formed.

3. The packaging method for the fan-out wafer-level packaging structure as in claim 1, wherein the dielectric layer comprises one or more of polyimides and polybenzoxazole, and the metal distribution layer comprises one or more elements of copper, aluminum, nickel, gold, silver, and titanium.

4. The packaging method for the fan-out wafer-level packaging structure as in claim 3, wherein the dielectric layer comprises polyimides, wherein the dielectric layer is baked for seconds at a temperature between 120° C. and 150° C., and wherein the fan-out wafer array is cured for 110-130 minutes at a temperature between 220° C. and 260° C.

5. The packaging method for the fan-out wafer-level packaging structure as in claim 4, wherein the dielectric layer is baked for 100 seconds at a temperature of about 120° C., and wherein the fan-out wafer array is cured for 120 minutes at a temperature of about 240° C.

6. The packaging method for the fan-out wafer-level packaging structure as in claim 1, wherein the bonding layer comprises one of an adhesive tape, a bonding adhesive made by a spin-coating process, and epoxy resin.

7. The packaging method for the fan-out wafer-level packaging structure as in claim 1, wherein the plastic packaging layer comprises one of polyimide, silica gel, and epoxy resin.

8. The packaging method for the fan-out wafer-level packaging structure as in claim 1, wherein a method for forming vias in the first redistribution sublayer comprises:

dividing the dielectric layer on the semiconductor chips into a plurality of to-be-etched dielectric layer units; and etching the plurality of to-be-etched dielectric layer units one by one in a predetermined order by photolithography to form vias in each of the plurality of to-be-etched dielectric layer units;

wherein the pads of each of the semiconductor chip are exposed from bottoms of the vias; and where a number of the plurality of to-be-etched dielectric layer units is equal to or larger than 2.

9. The packaging method for the fan-out wafer-level packaging structure as in claim 1, wherein the metal bump comprises one of a gold-tin solder ball, a silver-tin solder ball, and a copper-tin solder ball, or comprises a metal post and a solder ball formed on the metal post.

10. The packaging method for the fan-out wafer-level packaging structure as in claim 9, wherein the metal post comprises copper or nickel.

\* \* \* \* \*